(12) United States Patent
Pai et al.

(10) Patent No.: US 9,318,350 B2
(45) Date of Patent: Apr. 19, 2016

(54) METHOD AND APPARATUS FOR CONVERTING COMMERICAL OFF-THE-SHELF (COTS) THIN SMALL-OUTLINE PACKAGE (TSOP) COMPONENTS INTO RUGGED OFF-THE-SHELF (ROTS) COMPONENTS

(71) Applicant: General Dynamics Advanced Information Systems, Inc., Fairfax, VA (US)

(72) Inventors: Deepak Keshav Pai, Burnsville, MN (US); Melvin Eric Graf, Shakopee, MN (US)

(73) Assignee: General Dynamics Advanced Information Systems, Inc., Fairfax, VA (US)

(*) Notice: Subject to any disclaimer, the term of this patent is extended or adjusted under 35 U.S.C. 154(b) by 380 days.

(21) Appl. No.: 13/936,936

(22) Filed: Jul. 8, 2013

(65) Prior Publication Data

US 2014/0131307 A1    May 15, 2014

Related U.S. Application Data

(63) Continuation of application No. 10/824,641, filed on Apr. 15, 2004, now abandoned.

(60) Provisional application No. 60/463,187, filed on Apr. 15, 2003.

(51) Int. Cl.
| | |
|---|---|
| *B23K 26/362* | (2014.01) |
| *H01L 21/50* | (2006.01) |
| *H01L 21/60* | (2006.01) |
| *H01L 21/48* | (2006.01) |
| *B23K 26/36* | (2014.01) |

(Continued)

(52) U.S. Cl.
CPC .......... *H01L 21/4821* (2013.01); *B23K 26/362* (2013.01); *H01L 21/50* (2013.01); *H01L 23/49541* (2013.01); *H01L 23/49548* (2013.01); *H01L 2924/0002* (2013.01); *H05K 3/3426* (2013.01); *H05K 2201/10848* (2013.01)

(58) Field of Classification Search
CPC ...... B23K 26/362; H01L 21/50; H01L 21/60; H05K 3/02
USPC ............. 219/121.68, 121.69, 121.85; 216/94; 438/123
See application file for complete search history.

(56) References Cited

U.S. PATENT DOCUMENTS

| | | |
|---|---|---|
| 5,178,726 A | 1/1993 | Yu et al. |
| 5,219,640 A | 6/1993 | Gazit et al. |
| 5,969,465 A | 10/1999 | Neukermans et al. |

(Continued)

OTHER PUBLICATIONS

Non-final Office Action mailed Feb. 22, 2006 in U.S. Appl. No. 13/936,936.

(Continued)

*Primary Examiner* — Samuel M Heinrich
(74) *Attorney, Agent, or Firm* — Ingrassia, Fisher & Lorenz PC

(57) ABSTRACT

An embodiment of the invention generally relates to a method of converting a commercial off-the-shelf electrical lead to a rugged off-the-shelf electrical lead by laser machining a portion of the electrical lead. The method includes ablating material from the electrical lead of the commercial off-the-shelf component to reduce the moment of inertia or increase the flexibility of the electrical lead.

29 Claims, 4 Drawing Sheets

(51) Int. Cl.
*H01L 23/495* (2006.01)
*H05K 3/34* (2006.01)

(56) References Cited

U.S. PATENT DOCUMENTS

| | | | |
|---|---|---|---|
| 6,117,694 | A | 9/2000 | Smith et al. |
| 6,122,089 | A | 9/2000 | Minamoto et al. |
| 6,130,110 | A * | 10/2000 | Hashimoto ......... H01L 23/4985 257/E23.065 |
| 6,218,213 | B1 * | 4/2001 | Fjelstad ............. H01L 21/4821 257/E23.046 |
| 6,256,131 | B1 | 7/2001 | Wine et al. |
| 6,571,630 | B1 | 6/2003 | Weinberg et al. |
| 6,888,362 | B2 | 5/2005 | Eldridge et al. |
| 6,912,078 | B2 | 6/2005 | Kudrle et al. |
| 2002/0146200 | A1 | 10/2002 | Kudrle et al. |
| 2004/0053447 | A1 * | 3/2004 | Foster ................ H01L 21/4821 438/123 |
| 2008/0036034 | A1 * | 2/2008 | Juskey ............... H01L 23/3107 257/531 |

OTHER PUBLICATIONS

Final Office Action mailed Sep. 5, 2006 in U.S. Appl. No. 13/936,936.
Non-final Office Action mailed Mar. 8, 2007 in U.S. Appl. No. 13/936,936.
Final Office Action mailed Nov. 27, 2007 in U.S. Appl. No. 13/936,936.
Non-final Office Action mailed Sep. 30, 2008 in U.S. Appl. No. 13/936,936.

* cited by examiner

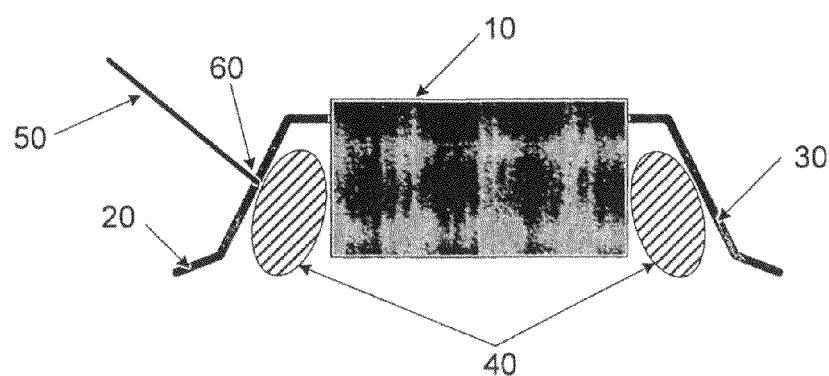
Figure 3A
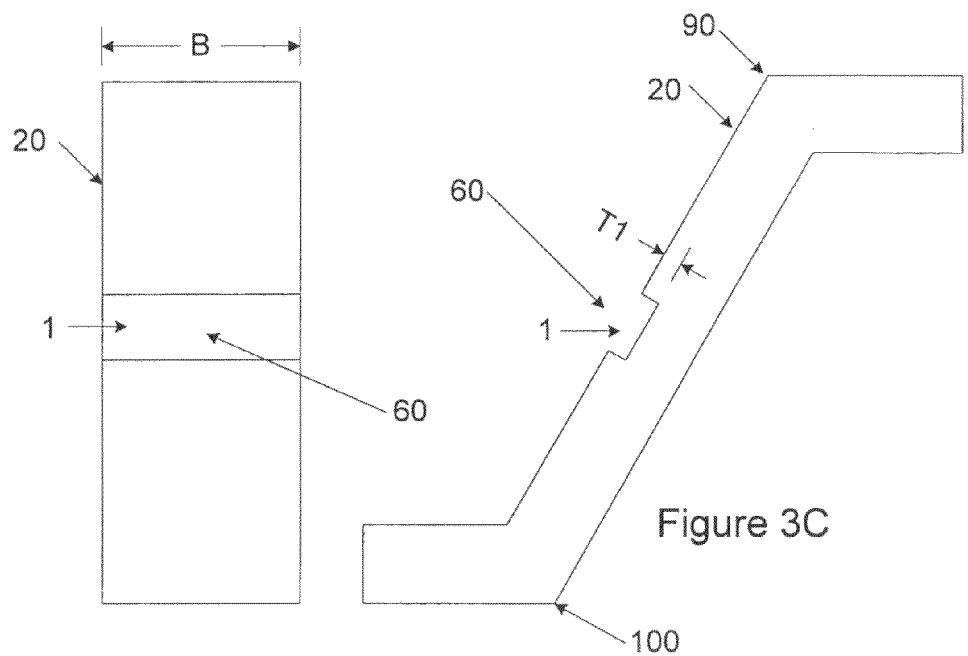
Figure 3B
Figure 3C

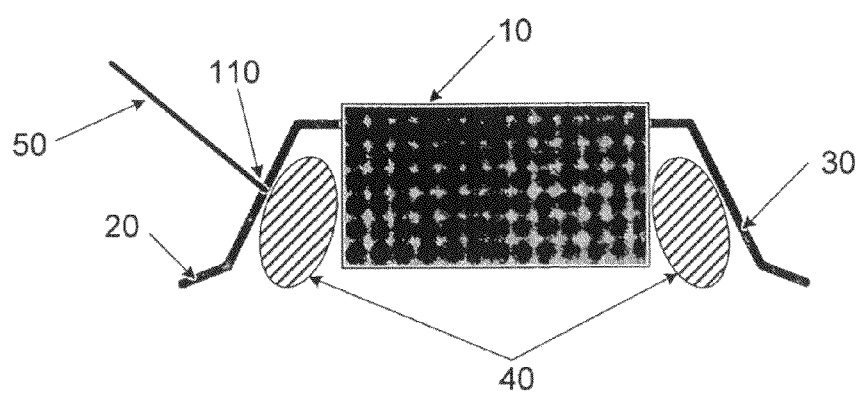
Figure 4A
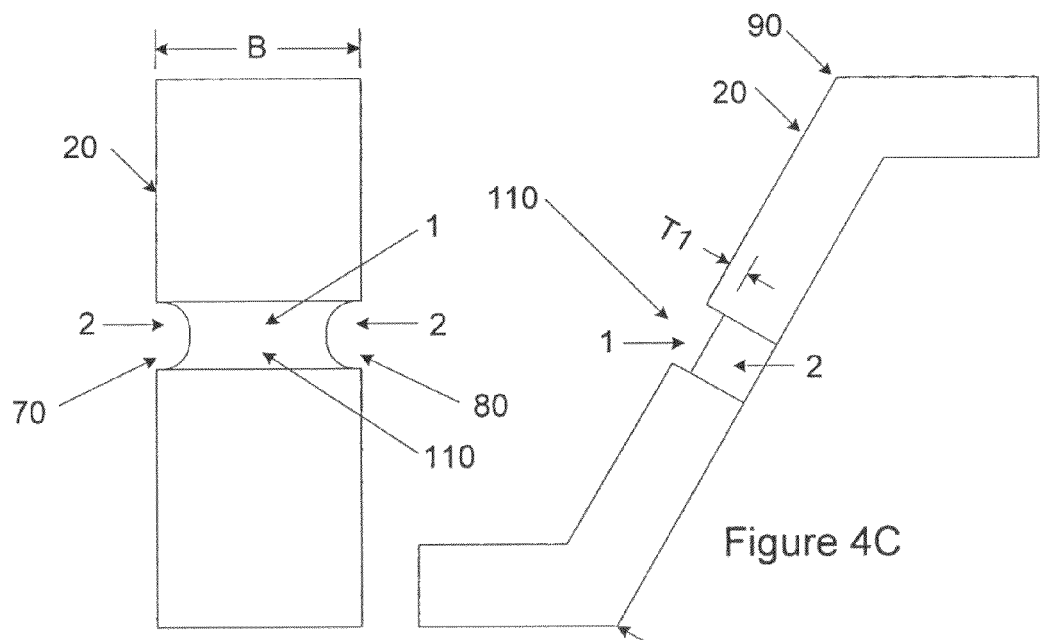
Figure 4B
Figure 4C

METHOD AND APPARATUS FOR CONVERTING COMMERICAL OFF-THE-SHELF (COTS) THIN SMALL-OUTLINE PACKAGE (TSOP) COMPONENTS INTO RUGGED OFF-THE-SHELF (ROTS) COMPONENTS

CROSS REFERENCE TO RELATED APPLICATIONS

This application claims priority to U.S. Provisional Application 60/463,187 filed on Apr. 15, 2003, which is incorporated in its entirety.

FIELD OF THE INVENTION

The present invention relates to a method for modifying an electrical component and more particularly to reducing the moment of inertia of leads that attach electronic components to circuit boards.

BACKGROUND OF THE RELATED ART

Thin small-outline package ("TSOP") components are used hi the assembly of many electronic consumer products having standard circuits, such as digital televisions, portables and computers. TSOP components also form the foundation of complex computing circuits such as motherboards and modules. For such standard applications, TSOP component are typically supplied in bulk as commercial off-the-shelf ("COTS") components.

COTS TSOP components are usually produced in a relatively large-size silicon die using lead frame materials such as Alloy 42 (which may be approximately 41% nickel 0.2% silicon and 0.4% manganese, and the remainder iron), Be:Cu (beryllium/copper). Alloy 25 or equivalent alloys, and Cu (copper). Alloy 42 is most often used due to the thermal coefficient of expansion ("TCE") of 6-7 ppm/deg C. Also, COTS TSOP components usually employ a gull-wing electrical lead with a relatively short length and a thickness of about 0.006±0.002 inch. The construction of COTS with these specification and loose quality control allows manufacturers to keep the cost of manufacturing low. Unfortunately, the short electrical lead length, TCE, and variability of the electrical lead thickness affect the reliability of the electrical leads and the solder joints that connect them.

As such, COTS components are not usually configured for the rugged conditions and the required reliability demanded by military applications and electronic systems used in harsh environments. Electronics located in these applications require a higher degree of reliability. Because of the variability of COTS components, some of the COTS components will satisfy the higher degree of reliability and some will not. Those COTS components that meet the higher degree of reliability are called rugged off-the-shelf ("ROTS") components.

One reason the majority of COTS components are not ROTS components is the moment of inertia or stiffness of the electrical leads on the COTS components. The short length and high stiffness of the electrical leads on COTS components may create undue tension and stress on solder joints and connections. Further, the stiffness of the electrical leads transmits forces and vibrations easily, creating stresses and fatigue in the component leads and overall structure. These stresses may cause failure of joints and the electrical leads and thus shorten the life and reduce reliability of the COTS components.

ROTS quality components, however, typically have more flexible electrical leads and therefore enjoy a longer life and greater reliability. Unfortunately, ROTS components require expensive testing and effort to identify the ROTS quality components from a group of COTS components. Further, due to the need for testing and evaluation, ROTS quality components require significant time to verify and, consequently, sufficient quantities may not be readily available for all applications at any given time.

Therefore, there exists a need for a method of and apparatus for modifying COTS components info components with ROTS quality electrical leads.

SUMMARY OF THE INVENTION

An embodiment of the present invention generally relates to a method of modifying an electronic component. The method includes directing at least one laser source onto a target area of the component. The method also includes generating a laser beam from the laser source such that the laser beam is incident on the target area and ablating material in the target area so that a moment of inertia of the component is reduced by a predetermined amount.

In one aspect, the target area includes a first dimension and in another aspect the target area includes a second dimension. Further, the method may include introducing an energy-absorbing substance, before generating the laser beam, adjacent the target area to absorb energy from the laser beam and/or the component. The method may also include directing optics to position an optical path of the laser source such that the optical path is incident on the target area.

In another embodiment, a method for modifying an electrical lead of an electronic component includes positioning a beat-absorbent material adjacent the electrical lead and directing at least one laser source such that an optical path of the at least one laser source is incident on the electrical lead. The method may also include generating a laser beam from the at least one laser source such that the laser beam is incident on the electrical lead and removing a portion of the electrical lead to form a trough substantially across the width of the electrical lead. The removed portion may reduce a moment of inertia of the electrical lead to a predetermined level.

In another aspect, the beat-absorbent material is water soluble. Also, the method may include removing a first notch across the depth of the electrical lead and a second notch across the depth of the electrical lead so that the first notch and the second notch are positioned at opposite ends of the trough. Further, the method may also include selecting a wavelength, a total firing time, a pulse length, a pulsing pattern, and a power of the laser beam.

In yet another embodiment, an apparatus for removing material in an electronic component includes a substrate upon which the component is mounted and at least one laser source positioned to direct a laser beam at a target area of the component. The apparatus may also include a control mechanism configured to control generating the laser beam to remove material from the target area by an amount sufficient to reduce a moment of inertia of the component to a predetermined level.

In yet another aspect, the control mechanism may be configured to control a wavelength, a total firing time, a pulse length, a pulsing pattern, and a power of the laser beam. Also, the apparatus may include optics configured to direct the laser beam from the at least one laser source at the target area of the component.

BRIEF DESCRIPTION OF THE DRAWINGS

While the specification concludes with claims particularly pointing out and distinctly claiming the present invention, it may be believed the same will be better understood from the following description taken in conjunction with the accompanying drawings, which illustrate, in a non-limiting fashion, the best mode presently contemplated for carrying out the present invention, and in which like reference numerals designate like parts throughout the figures, wherein:

FIG. 3A illustrates a method of converting a commercial off-the-shelf electrical lead in accordance with another embodiment of the invention;

FIGS. 3B and 3C illustrate front and side profiles of an electrical lead in accordance with the embodiment of FIG. 3A;

FIG. 4A illustrates a method of converting a commercial off-the-shelf electrical lead in accordance with yet another embodiment of the invention; and FIGS. 4B and 4C illustrate front and side profiles of an electrical lead in accordance the embodiment of FIG. 4A.

DETAILED DESCRIPTION OF THE EMBODIMENTS

For simplicity and illustrative purposes, the principles of the present invention are described by referring mainly to exemplary embodiments thereof. However, one of ordinary skill in the art would readily recognize that the same principles are equally applicable to, and can be implemented in, many types of electrical lead construction and modification, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

The present invention generally relate to a method of converting COTS components into ROTS components through the removal of material from the electrical leads. More particularly, the method includes generating and directing a laser to ablate a portion of the electrical leads of COTS components to reduce the moment of inertia, of the electrical leads. The methods are configured to increase the life and reliability of COTS components to meet the more stringent requirements of ROTS components.

The present invention, may produce a more reliable electrical lead configuration that may be obtained by laser-machining the electrical leads on COTS components. The laser machining reduces the moment of inertia or stiffness of the electrical leads by removing a portion of the electrical leads, effectively reducing the thickness and/or width of the electrical leads. The lower moment of inertia (or greater flexibility) reduces the stress on the joints or other connections in the component, and increases the reliability and longevity of the components and the systems into which they are installed.

Figure 1A:
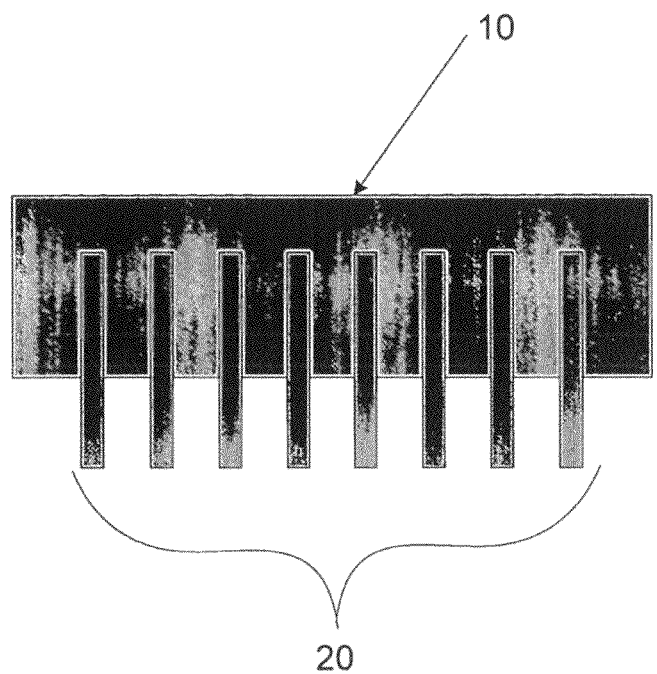
FIGS. 1A and 1B illustrate an example of a commercial off-the-shelf component in accordance with an embodiment of the invention.
Figure 1B:
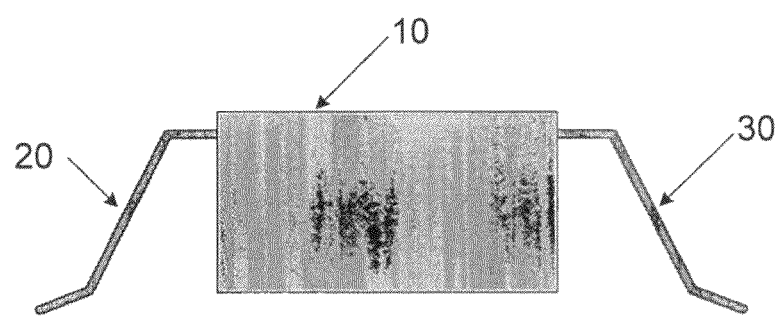

FIGS. 1A and 1B illustrate a typical COTS TSOP component 10. In FIG. 1A, a side view, electrical leads 20 are shown along the length of the component 10. In FIG. 1B, a end view, the electrical leads 20 are also shown on the left side of the component 10 and the electrical leads 30 are shown on the right side of the component 10.

Figure 2A:
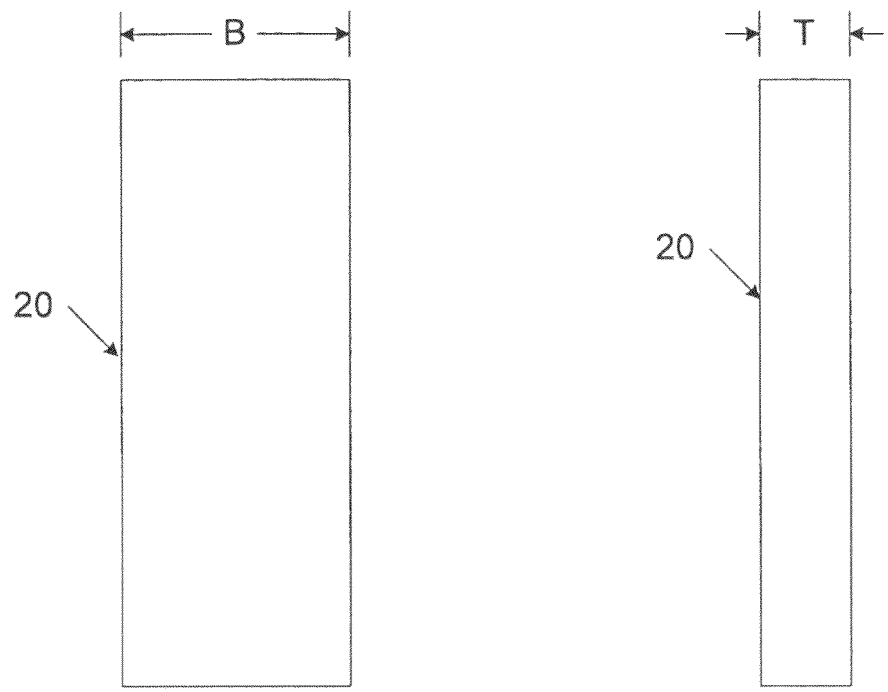
FIG. 2A illustrates front and side profiles of an electrical lead before laser machining in accordance with an embodiment of the invention.
Figure 2B:
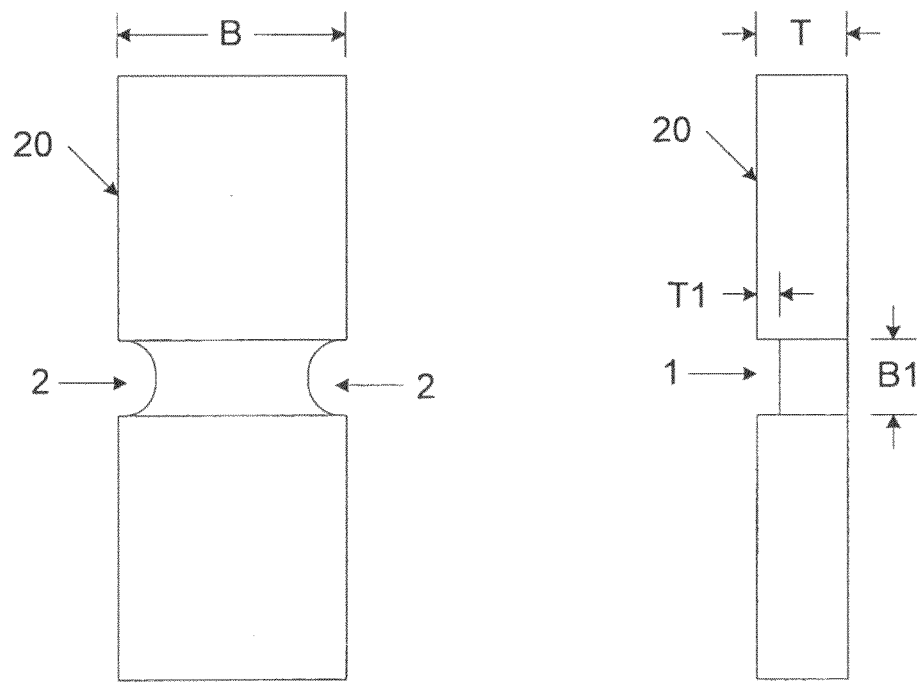
FIG. 2B illustrates front and side profiles of an electrical lead after laser machining in accordance with an embodiment of the invention.

FIG. 2A illustrates front and side profiles of an electrical lead 20 before laser machining a portion of material from the electrical lead 20. FIG. 2B illustrates front and side profiles of an electrical lead 20 after laser machining a portion of material from the electrical lead 20. The width of the electrical lead 20 is shown as B and the thickness or height of the electrical lead 20 is shown as T. FIG. 2A also shows a first portion removed from, the lead 20 in the side profile and a second portion removed from the front profile. As shown, the first portion forms a trough 1 across the width of the lead 20. The second portion forms notches 2 across the depth of the electrical lead 20 on either side of the trough 1. The dimensions of the trough as shown are depth T1 and height B1. The dimensions of die notches 2 are a half circle with diameter of B1 as shown in FIG. 2B.

It should be noted that the electrical leads 20 and 30 may be modified as shown in FIG. 2B or the leads 20 and 30 may be modified to include only the trough 1 or only one or both notches 2. It should also be noted that the overall thickness and width of the lead 20 is reduced, essentially reducing the cross-sectional area of the lead 20 in the region that the lead 20 is modified. The leads 20 and 30 may be reduced in mass at certain regions by laser machining or other processes (e.g., etching, cutting, extruding, grinding, etc., either during the initial manufacture process or afterwards).

The stiffness of an electrical lead 20 is a function of the moment of inertia of the lead. If the moment of inertia of an electrical lead 20 is reduced, then the stiffness of the electrical lead is also reduced. The moment of inertia is a function of the cross-sectional dimensions of the electrical lead 20. The moment of inertia before laser machining may be defined by the formula:

$$I = \frac{(BT^3)}{12}$$

A reduction of thickness by 50% reduces the moment of inertia by a factor of 8. Therefore, the moment of inertia may be significantly reduced by reducing the dimensions of the cross-sectional area by T1 in the thickness and B1 in the width. The moment of inertia after laser machining may be defined by the formula:

$$I = \frac{(B-B1)(T-T1)^3}{12}$$

FIG. 3A illustrates an embodiment of the present invention for ablating or removing a portion of material from the electrical lead 20 of a typical COTS TSOP electrical lead. A laser source (not shown in the figures) is directed at a region or target area 60 of the electrical lead 20. FIGS. 3B and 3C illustrate front and side profiles respectively of the electrical lead 20 of the component 10 after laser machining. In FIG. 3C, the region 60 is located between joints 90 and 100 and the laser source is directed such that, an optical path or laser beam 50 is incident on the region 60. Although the region 60 is located between joints 90 and 100, the region 60 might be located on other portions of the electrical lead 20 without deviating from the scope and spirit of the present invention.

In the embodiment of FIG. 3A, a laser beam 50 is generated by the laser source. The laser beam 50 ablates or melts the region 60 of the electrical lead 20 to form a trough 1 as shown in FIG. 2B. With the removal of the material in region 60 and the formation of the trough 1, the moment of inertia may be defined by the formula:

$$I = \frac{(B)(T-T1)^3}{12}$$

The amount of material removed is dependent on the desired stiffness or flexibility of the electrical lead 20 after laser machining. The thickness of the remaining material (T−T1) may be between 0.003 and 0.004 inch to achieve the moment of inertia and the flexibility of a ROTS component. However, the thickness of the remaining material and the amount of material removed from region 60 may be adjusted to accommodate more or less thickness depending on the requirements of the application. Because COTS components have variability in the dimensions of the electrical leads, the amount of material removed T1 may vary with each electrical lead so as to generate a desired moment of inertia.

In FIG. 3A, the component 10 is positioned with leads 20 and 30 as shown. The leads 20 and 30 may be connected to a substrate (not shown) or the component 10 may be held in a fixture (also not shown). Upon ablating material in the region 60, the component 10 and the leads 20 and 30 may be exposed to heat and energy from the laser beam. To protect against damage from the heat and energy, a heat absorbing material 40 may be placed adjacent to and around the region 60. The beat absorbing material 40 may be a water-soluble sacrificial filler. The beat absorbing material 40 may also be used to protect any substrate that the component 10 may be mounted on during the laser machining process.

FIG. 4A illustrates another embodiment of the present invention for ablating or removing a portion of material from, the electrical lead 30 of a typical COTS TSOP electrical lead. A laser source (not shown in the figures) is directed at a region, or target area 110 of the electrical lead 20. FIGS. 4B and 4C illustrate front and side profiles respectively of the electrical lead 20 of the component 10 after laser machining. In FIG. 4C the region 110 is located between joints 90 and 100 and the laser source is directed such that an optical path or laser beam 50 is incident on the region 110. Although the region 110 is located between joints 90 and 100, the region 110 might be located on other portions of the electrical lead 20 without deviating from the scope and spirit of the present invention.

In the embodiment of FIG. 4A, a laser beam 50 is generated by the laser source. The laser beam 50 ablates or melts the region 110 of the electrical lead 20 to form a trough 1 with ends 70 and 80. The laser beam 50 also ablates or melts the region 110 to form notches 2 at both ends 70 and 80 of the trough 1 as shown in FIG. 2B. With the removal of the material in region 110 and the formation of the trough 1 and notches 2, the moment of inertia may be defined by the formula:

$$I = \frac{(B-B1)(T-T1)^3}{12}$$

The amount of material removed is dependent on the desired stiffness or flexibility of the electrical lead 20 after laser machining. The thickness of the remaining material (T−T1) may be between 0.003 and 0.004 inch to achieve the moment of inertia and the flexibility of a ROTS component. However, the thickness of the remaining material and the amount of material removed from region 110 may be adjusted to accommodate more or less thickness depending on the requirements of the application. Likewise, the width of the remaining material (B−B1) may be between 0.006 and 0.008 inch to achieve the moment of inertia and the flexibility of a ROTS component. However, the width of the remaining material and the amount of material removed from region 110 may be adjusted to accommodate more or less width depending on the requirements of the application. Because COTS components have variability in the dimensions of the electrical leads, the amount of thickness removed T1 and the amount of width removed B1 may vary with each electrical lead so as to generate a desired moment of inertia.

In FIG. 4A, the component 10 is positioned with leads 20 and 30 as shown. The leads 20 and 30 may be connected to a substrate (not shown) or the component 10 may be held in a fixture (also not shown). Upon ablating material in the region 110, the component 10 and the leads 20 and 30 may be exposed to heat and energy from, the laser beam. To protect against damage from the heat and energy, a heat absorbing material 40 may be placed adjacent to and around the region 110. The heat absorbing material 40 may be a water-soluble sacrificial filler. The heat absorbing material 40 may also be used to protect any substrate that the component 10 may be mounted on during the laser machining process.

It should be noted that the heat absorbing material in the embodiments of FIGS. 3A and 4A may also include means of cooling the leads and components to protect against heat and energy damaging the component. The means for cooling may include convective cooling with fluids or gases. Reflective coatings or materials may also be employed to surround sensitive components and reflect heat and energy.

Referring to the embodiments of both FIGS. 3A and 4A, the trough 1 and the notches 2 may all be formed by a single laser beam in a multi-step repositioning process. The laser source and the laser beam 50 may therefore be repeatedly positioned such that the laser beam 50 is incident on the appropriate regions 60 and 110. It is also possible that the laser source may remain stationary and the component 10 may be repositioned such that the laser beam 50 is incident on the appropriate regions 60 and 110. Additionally, optics may be provided such that the single laser beam is repeated directed to form the trough 1 and the notches 2 without repositioning the laser source. The optics may include mirrors, lenses and other optical equipment used to direct, focus and manipulate lasers. Alternatively, multiple laser beams from one or more laser sources may be used to ablate or melt the trough 1 and the notches 2 without repositioning the laser source or the component.

It should be noted that the laser source or sources might, encompass many types of lasers suitable for the present invention. CO2 and Nd:YAG lasers and many others known in the art could remove the desired material from the electrical leads 20 and 30. Further, the laser sources may employ various wavelengths, total firing times, pulse lengths, pulsing patterns, and different power levels as generally known in the art.

It should also be noted that the laser source might be directed for a period of time sufficient to melt or vaporize material in regions 60 and 110 or the laser source may be pulsed with sufficient time between pulses to prevent overheating of the electrical leads 20 and 30, the component 10 or the substrate or fixture. Further, the laser beam may be redirected as desired to different locations on a lead or to different leads on the component 10, returning to finish removing material from a particular electrical lead after heat and energy has dissipated.

Other material removal patterns are possible. Note that in the embodiments shown in FIGS. 3A and 4A the ablated regions 60 and 110 are located at a portion of the electrical leads 20 and 30 spaced from bends or joints 90 and 100 to avoid weakening or disrupting these areas. By increasing the flexibility between the joints, the present invention may relieve some stresses and forces on the joints 90 and 110. The increased flexibility may also relieve some stresses and forces on the soldered joints between the components and the substrate and joints within the component itself. The dimensions of the ablated regions may be increased or decreased and/or repositioned on the leads as needed to achieve the desired level of reduction in moment of inertia. Also note that in some embodiments multiple troughs may be formed on a given electrical lead.

Instead of a laser, other material removal devices may be used, including those using any wavelengths (frequencies) desired, and including incoherent energy sources. Control mechanisms may include computer-controlled systems, including preprogrammed software-driven lasers acting in cooperation with (and optionally controlling) robotic devices to manipulate components as needed.

The embodiments of the present invention may also be used to convert COTS TSOP components into ROTS components before or during the components manufacture and before or after installation of components.

While the invention has been described with reference to the exemplary embodiments thereof, those skilled in the art will be able to make various modifications to the described embodiments without departing from the true spirit and scope. The terms and descriptions used herein are set forth by way of illustration only and are not meant as limitations. In particular, although the method has been described by examples, the steps of the method may be performed in a different order than illustrated or simultaneously. Those skilled in the art will recognize that these and other variations are possible within the spirit and scope as defined in the following claims and their equivalents.

The invention claimed is:

1. A method for modifying a lead of a Thin Small-Outline Package (TSOP) circuit, the method comprising:
   directing at least one laser source onto a target area located on the lead of the TSOP circuit;
   generating a laser beam from the at least one laser source such that the laser beam is incident on the target area of the lead of the TSOP circuit; and
   ablating material in the target area so that a moment of inertia of the lead of the TSOP circuit is reduced by a predetermined amount.

2. The method of claim 1, wherein the ablated material forms a trough.

3. The method of claim 1, wherein the ablated material forms at least one notch.

4. The method of claim 1, wherein the step of ablating material reduces a width of the lead of the TSOP circuit in the target area to between about 0.006 to 0.008 inch.

5. The method of claim 1, further comprising:
   directing optics to establish an optical path of the laser source such that the optical path is incident on the target area.

6. The method of claim 1, further comprising:
   before said ablating, inserting an energy-absorbing substance between a body of the TSOP circuit and the lead.

7. A method for modifying a lead of an integrated circuit, the method comprising the steps of:
   directing at least one laser source onto a target area located on the lead;
   generating a laser beam from the at least one laser source such that the laser beam is incident on the target area of the lead;
   introducing, prior to said generating, an energy-absorbing substance adjacent the target area to absorb energy from at least one of the laser beam or the lead; and
   ablating material in the target area so that a moment of inertia of the lead is reduced by a predetermined amount.

8. The method of claim 7, wherein the ablated material forms a trough.

9. The method of claim 8, wherein the step of ablating material reduces a height of the lead in the target area to between about 0.003 to 0.004 inch.

10. The method of claim 7, wherein the ablated material forms at least one notch.

11. The method of claim 10, wherein the step of ablating material reduces a width of the lead in the target area to between about 0.006 to 0.008 inch.

12. The method of claim 7, further including the step of:
   directing optics to establish an optical path, of the laser source such that the optical path is incident on the target area.

13. The method of claim 7, wherein the integrated circuit is a commercial off-the-shelf component.

14. The method of claim 7, wherein said introducing comprises inserting the energy-absorbing substance between a body of the integrated circuit, and the lead.

15. A method for modifying a lead of an integrated circuit, the method comprising the steps of:
   directing at least one laser source onto a target area located on the lead;
   generating a laser beam from the at least one laser source such that the laser beam is incident on the target area of the lead; and
   ablating material in the target area so that a moment of inertia of the lead is reduced by a predetermined amount;
   wherein the step of ablating material reduces a height of the lead in the target area to between about 0.003 to 0.004 inch.

16. The method of claim 15, wherein the ablated material forms a trough.

17. The method of claim 15, wherein the ablated material forms at least one notch.

18. The method of claim 15, wherein the step of ablating material reduces a width of the lead in the target area to between about 0.006 to 0.008 inch.

19. The method of claim 15, further comprising:
   setting an optical path of the laser source incident on the target area.

20. The method of claim 15, wherein the integrated circuit is a commercial off-the-shelf component.

21. The method of claim 15, wherein said generating comprises targeting said laser beam on the lead.

22. The method of claim 15, further comprising:
before said ablating, inserting an energy-absorbing substance between a body of the integrated circuit and the lead.

23. A method for modifying a stiff lead of an integrated circuit, the method comprising the steps of:
directing at least one laser source onto a target area located on the stiff lead;
generating a laser beam from the at least one laser source such that the laser beam is incident on the target area of the stiff lead; and
ablating stiff material of the lead in the target area so that a moment of inertia of the stiff lead is reduced by a predetermined amount, wherein the step of ablating material reduces a width of the stiff lead in the target area to between about 0.006 to 0.008 inch.

24. The method of claim 23, wherein the ablated material forms a trough.

25. The method of claim 23, wherein the ablated material forms at least one notch.

26. The method of claim 23, further comprising:
directing optics to position an optical path of the laser source such that the optical path is incident on the target area.

27. The method of claim 23, wherein the integrated circuit is a commercial off-the-shelf component.

28. The method of claim 23, wherein said generating comprises targeting said laser beam on the lead.

29. The method of claim 28, farther comprising:
before said ablating, inserting an energy-absorbing substance between a body of the integrated circuit and the lead.

* * * * *